(12) United States Patent
Kim

(10) Patent No.: US 9,853,042 B2
(45) Date of Patent: Dec. 26, 2017

(54) SEMICONDUCTOR DEVICE AND METHOD OF MANUFACTURING THE SAME

(71) Applicant: SK hynix Inc., Gyeonggi-do (KR)

(72) Inventor: Jong Man Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 111 days.

(21) Appl. No.: 14/314,933

(22) Filed: Jun. 25, 2014

(65) Prior Publication Data

US 2015/0243672 A1   Aug. 27, 2015

(30) Foreign Application Priority Data

Feb. 25, 2014   (KR) ........................ 10-2014-0022007

(51) Int. Cl.
| | | |
|---|---|---|
| H01L 27/115 | (2017.01) | |
| H01L 29/66 | (2006.01) | |
| H01L 21/28 | (2006.01) | |
| H01L 29/792 | (2006.01) | |
| H01L 27/11582 | (2017.01) | |
| H01L 27/1157 | (2017.01) | |

(52) U.S. Cl.
CPC .. *H01L 27/11582* (2013.01); *H01L 21/28282* (2013.01); *H01L 27/1157* (2013.01); *H01L 29/66833* (2013.01); *H01L 29/7926* (2013.01)

(58) Field of Classification Search
CPC ................................................ H01L 27/11582
See application file for complete search history.

(56) References Cited

U.S. PATENT DOCUMENTS

| | | | | |
|---|---|---|---|---|
| 8,507,973 | B2 * | 8/2013 | Lee ................... | H01L 27/11582 257/324 |
| 2009/0090959 | A1 * | 4/2009 | Nishihara ......... | H01L 27/11578 257/324 |
| 2010/0213537 | A1 * | 8/2010 | Fukuzumi ......... | H01L 27/11578 257/326 |
| 2011/0024816 | A1 * | 2/2011 | Moon ............... | H01L 27/11578 257/314 |
| 2012/0083077 | A1 * | 4/2012 | Yang ................. | H01L 27/11582 438/156 |
| 2012/0126308 | A1 * | 5/2012 | Kim .................. | H01L 27/11524 257/324 |

(Continued)

FOREIGN PATENT DOCUMENTS

| | | |
|---|---|---|
| KR | 1020100106911 | 10/2010 |
| KR | 1020150067811 | 6/2015 |

OTHER PUBLICATIONS

R. Katsumata et al. Pipe-shaped BiCS Flash Memory with 16 Stacked Layers and Multi-Level-Cell Operation for Ultra High Density Storage Devices. Symp. on VLSI Tech. Dig. pp. 136-137, Jun. 16-18, 2009.*

*Primary Examiner* — Mary Wilczewski
*Assistant Examiner* — Erik T Peterson
(74) *Attorney, Agent, or Firm* — IP & T Group LLP

(57) ABSTRACT

The semiconductor device includes a stacked structure having alternately stacked conductive patterns and interlayer insulating patterns, a through-hole passing through the stacked structure, a channel pattern formed in the through-hole and protruding from an inside of the through hole over the through-hole, and a capping conductive pattern formed to be in contact with the protruded channel pattern and have a width greater than the through-hole.

13 Claims, 7 Drawing Sheets

(56) References Cited

U.S. PATENT DOCUMENTS

| | | | | |
|---|---|---|---|---|
| 2012/0181602 A1* | 7/2012 | Fukuzumi | ............ | H01L 27/0688 |
| | | | | 257/326 |
| 2012/0299005 A1* | 11/2012 | Lee | .................... | H01L 27/11582 |
| | | | | 257/66 |
| 2013/0009229 A1* | 1/2013 | Lee | .................... | H01L 29/66833 |
| | | | | 257/314 |
| 2013/0161717 A1* | 6/2013 | Choi | ................. | H01L 27/11582 |
| | | | | 257/314 |
| 2015/0287735 A1* | 10/2015 | Jeon | .................... | H01L 27/1157 |
| | | | | 257/324 |
| 2016/0005747 A1* | 1/2016 | Lee | ..................... | H01L 27/1157 |
| | | | | 257/329 |

* cited by examiner

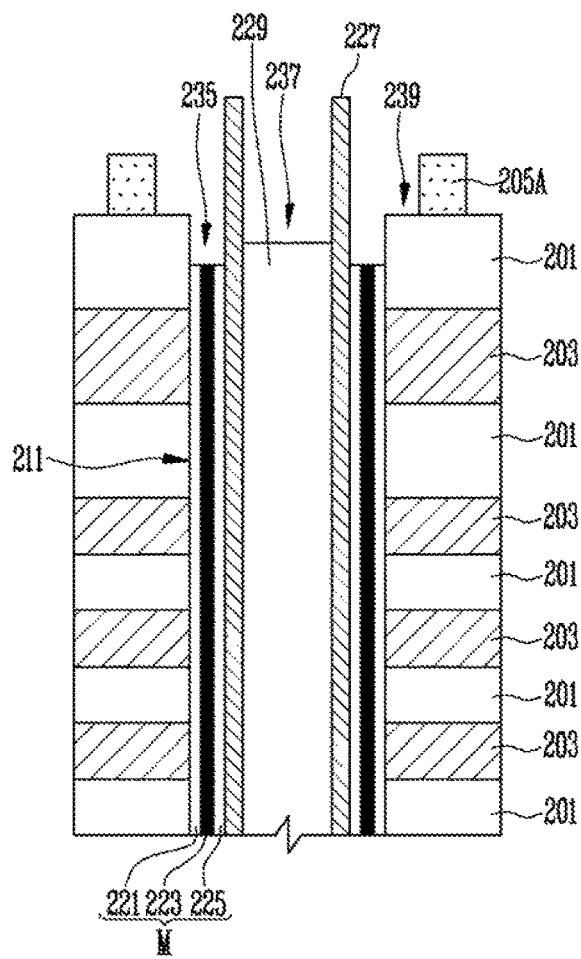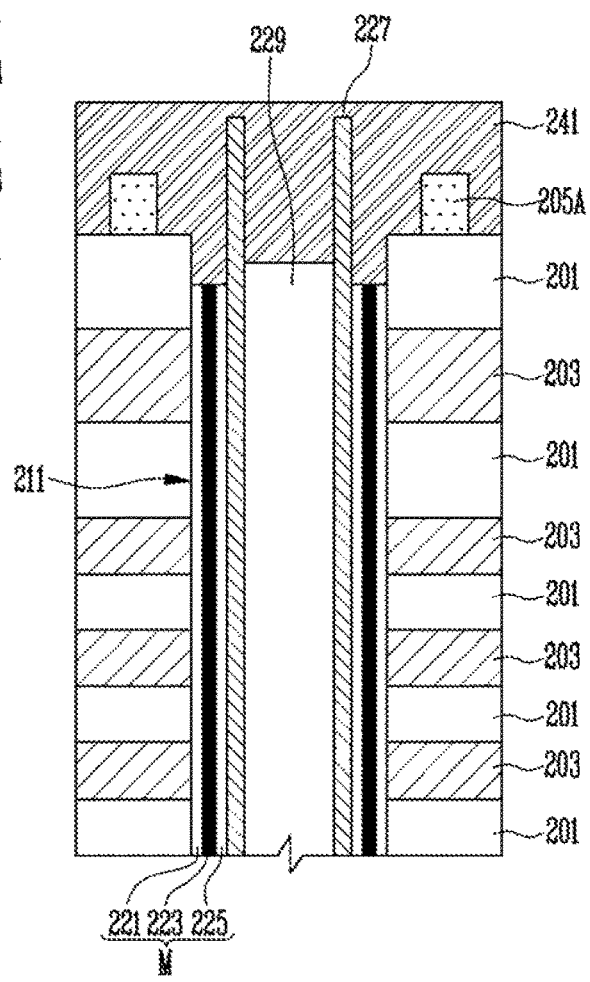

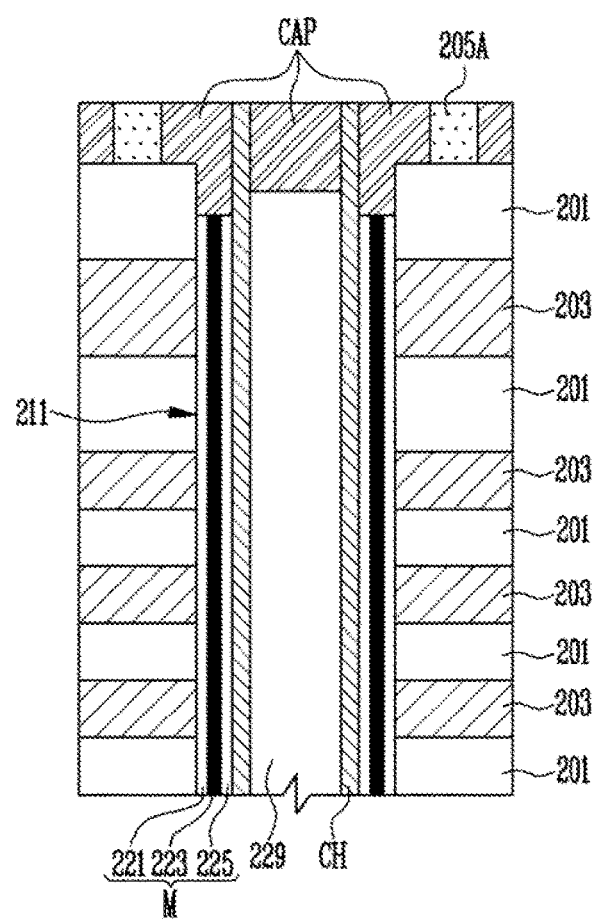
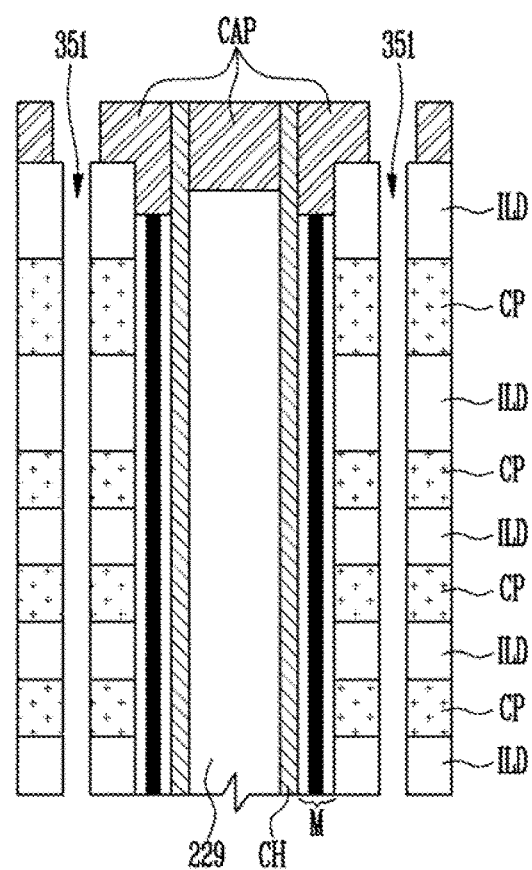

SEMICONDUCTOR DEVICE AND METHOD OF MANUFACTURING THE SAME

CROSS-REFERENCE TO RELATED APPLICATION

The present application claims priority to Korean patent application number 10-2014-0022007, filed on Feb. 25, 2014, the entire disclosure of which is incorporated herein in its entirety by reference.

BACKGROUND

Field of Invention

Various exemplary embodiments of the present invention relate to a semiconductor device and a method of manufacturing the same, and more specifically, to a semiconductor device including a channel layer passing through a stacked structure and a method of manufacturing the same.

Description of Related Art

A semiconductor device includes a memory device that may store data. A three-dimensional memory device in which memory cells are stacked along a channel pattern passing through a stacked structure, has been proposed. The three-dimensional memory device has an advantageous structure for integration. The stacked structure includes alternately stacked interlayer insulating patterns and conductive patterns. A channel pattern of the three-dimensional memory device may be connected to a conductive line to which an external signal is applied via a contact plug.

Since the above-described channel pattern has a small surface area, an overlay margin while forming a contact plug on the channel pattern may not be ensured.

SUMMARY

Exemplary embodiments of the present invention are directed to a semiconductor device that reduces difficulty in a manufacturing process of a semiconductor device having a channel pattern, and a method of manufacturing the same.

A semiconductor device according to an embodiment of the present invention may include a stacked structure having alternately stacked conductive patterns and interlayer insulating patterns, a through-hole passing through the stacked structure, a channel pattern formed in the through-hole and protruding from an inside of the through hole over the through-hole, and a capping conductive pattern formed to be in contact with the protruded channel pattern and have a width greater than the through-hole.

A method of manufacturing a semiconductor device according to an embodiment of the present invention may include alternately stacking first material layers and second material layers, forming a mask pattern including a first opening area on the first and second material layers, forming a through-hole passing through the stacked first and second material layers by etching the stacked first and second material layers exposed by the first opening area, forming a channel pattern protruding from an inside of the through-hole over the through-hole, reducing a size of the mask pattern to define a second opening, wherein the second opening area has a width greater than the first opening area and exposes a part of the uppermost surface of the stacked first and second material layers, forming a capping conductive pattern filling the second opening area, and removing the reduced mask pattern.

BRIEF DESCRIPTION OF THE DRAWINGS

The above and other features and advantages of the present invention will become more apparent to those of ordinary skill in the art by illustrating in detail exemplary embodiments thereof with reference to the attached drawings in which:

FIGS. 2A to 2E are cross-sectional views illustrating a method of manufacturing a semiconductor device according to an embodiment of the present invention;

FIG. 3 is a cross-sectional view illustrating a method of manufacturing a semiconductor device according to an embodiment of the present invention;

DETAILED DESCRIPTION

Figure 1:
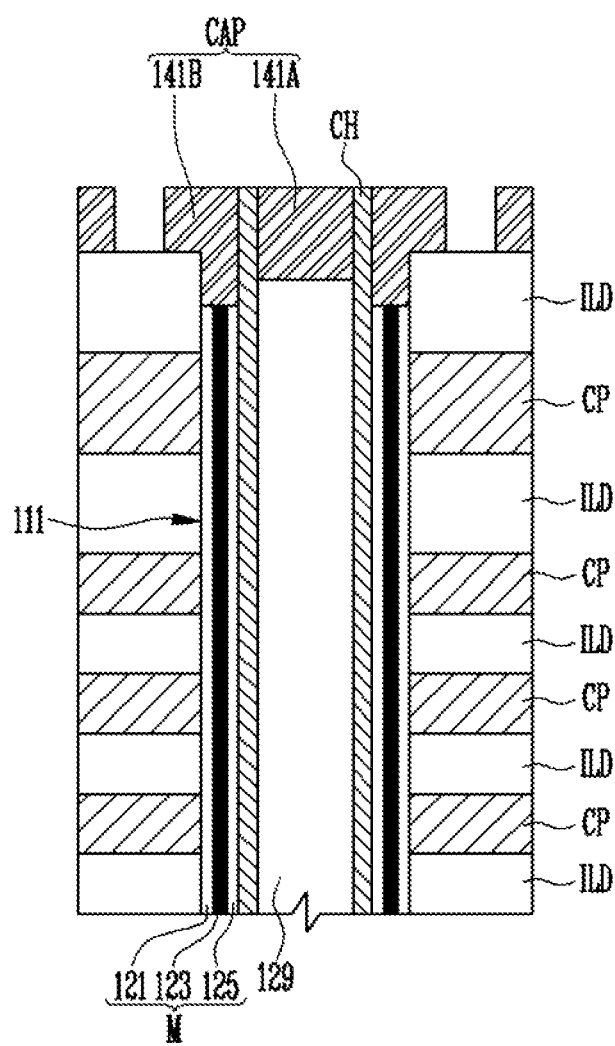
FIG. 1 is a cross-sectional view illustrating a semiconductor device according to an embodiment of the present invention.

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The present invention is described herein with reference to cross-section and/or plan illustrations that are schematic illustrations of preferred embodiments of the present invention. However, embodiments of the present invention should not be construed as limited to the present invention. Although a few embodiments of the present invention will be shown and described, it will be appreciated by those of ordinary skill in the art that changes may be made in these exemplary embodiments without departing from the principles and spirit of the present invention.

FIG. 1 is a cross-sectional view illustrating a semiconductor device according to an embodiment of the present invention.

Referring to FIG. 1, the semiconductor device according to the embodiment of the present invention includes a stacked structure having alternately stacked conductive patterns CP and interlayer insulating patterns ILD, a through-hole 111 passing through the stacked structure, a through-structure formed in the through-hole 111, and a capping conductive pattern CAP formed on the through-structure to have a greater width than the through-hole 111.

The conductive patterns CP composing the stacked structure may include at least one of a polysilicon layer, a metal layer, and a metal silicide layer. The interlayer insulating patterns ILD may include a silicon oxide layer. The uppermost insulating pattern among the interlayer insulating patterns ILD may be disposed as the uppermost layer of the stacked structure. At least one conductive pattern from the uppermost layer among the conductive patterns CP may be used as a select line of a non-volatile memory device.

The through-structure includes a multilayered dielectric pattern M, a channel pattern CH, and a core insulating layer 129. FIG. 1 shows only a part of the through-structure, however, the overall shape of the through-structure may be formed in various types, such as a straight-type, a U type, a W type, depending on the shape of a cell structure to be formed.

The core insulating layer 129 may be formed to fill a center part of the through-hole 111, and have a smaller height than the stacked structure and the through-hole 111. Specifically, to ensure threshold voltage characteristics of the select line and reduce leakage currents, the core insulating layer 129 may be lower than an upper surface of the uppermost insulating pattern formed on the uppermost layer among the interlayer insulating patterns ILD, and higher than an upper surface of a conductive pattern (i.e. the select line) disposed under the uppermost insulating pattern. The core insulating layer 129 may include a silicon oxide layer formed by annealing poly silazane (PSZ).

The channel pattern CH may be formed in the type of a tube surrounding the core insulating layer 129 along an inner wall of the through-hole 111. The channel pattern CH is formed to be higher than the uppermost surface of the stacked structure and the through-hole 111 to protrude over the uppermost surface of the stacked structure and the through-hole 111. The capping conductive pattern CAP may be formed to be in contact with a surface of the channel pattern CH including a sidewall of the channel pattern CH. Particularly, the sidewall of the channel pattern CH protruding over the through-hole 111 is in contact with the capping conductive pattern CAP and surrounded by the capping conductive pattern CAP. Accordingly, since a contact area between the channel pattern CH and the capping conductive pattern CAP is greater than when the channel pattern CH is formed to have the same height as the uppermost surface of the stacked structure and the through-hole 111, resistance of the channel pattern CH may be reduced. Although not shown in the drawing, the capping conductive pattern CAP may be formed to cover an upper surface of the channel pattern CH and to contact the upper surface of the channel pattern CH. The channel pattern CH may be formed of a semiconductor material, for example, an undoped polysilicon layer.

Alternatively, the channel pattern CH may fill the center part of the through-hole 111 and protrude over the through-hole 111, then the core insulating layer 129 may not be formed.

The multilayered dielectric pattern M may include a tunnel insulating layer 125 surrounding the channel pattern CH, a data storage layer 123 surrounding the tunnel insulating layer 125, and a charge blocking layer 121 surrounding the data storage layer 123. The tunnel insulating layer 125 may be formed of an insulating material that allows charge tunneling, for example, a silicon oxide layer. The data storage layer 123 may be formed of an insulating material that allows charge trapping, for example, a silicon nitride layer. The charge blocking layer 121 may be formed of an insulating material that allows charge blocking, for example, at least one of a silicon oxide layer and a high dielectric layer having a higher dielectric constant than the silicon oxide layer. The multilayered dielectric pattern M may be formed to be lower than the channel pattern CH. Since the contact area between the channel pattern CH and the capping conductive pattern CAP is greater than when the multilayered dielectric pattern M is formed to have the same height as channel pattern CH, resistance of the channel pattern CH may be reduced. Additionally, the multilayered dielectric pattern M may be formed to be higher than the uppermost conductive pattern among the conductive patterns CP and lower than the core insulating layer 129.

The capping conductive pattern CAP is formed to cover the core insulating layer 129 and the multilayered dielectric pattern M, to surround the channel pattern CH, and to have a greater width than the through-hole 111. When the capping conductive pattern CAP is formed to have a greater width than the through-hole 111, a contact margin of the capping conductive pattern CAP may be enlarged, and therefore an overlay margin of a contact plug (not shown) to be formed on the capping conductive pattern CAP may be enlarged. The capping conductive pattern CAP may be formed of an undoped polysilicon layer or a doped polysilicon layer. The capping conductive pattern CAP includes a first part 141A filling the center part of the channel pattern CH on the core insulating layer 129, and a second part 141B filling an inside of the through-hole 111 on the multilayered dielectric pattern M and covering a part of an upper surface of the stacked structure. The first part 141A and the second part 141B of the capping conductive pattern CAP are formed to be higher than the uppermost surface of the stacked structure and the through-hole 111, and protrude over the uppermost surface of the stacked structure and the through-hole 111.

According to the embodiment of the present invention, resistance of a tube-type channel pattern CH may be reduced by contacting the tube-type channel pattern CH with the capping conductive pattern CAP that is formed having a relatively wide width. Additionally, according to the embodiment of the present invention, since the channel pattern CH is in contact with the capping conductive pattern CAP over the stacked structure and the through-hole 111 by protruding the channel pattern CH over the stacked structure and the through-hole 111, a contact area between the channel pattern CH and the capping conductive pattern CAP may be enlarged. Further, according to the embodiment of the present invention, since the channel pattern CH is in contact with the capping conductive pattern CAP in the through-hole 111 by forming the core insulating layer 129 and the multilayered dielectric pattern M to be lower than the through-hole 111, the contact area between the channel pattern CH and the capping conductive pattern CAP may be enlarged. Further, according to the embodiment of the present invention, since the capping conductive pattern CAP is formed to have a greater width than the through-hole 111, an overlay margin of a contact plug (not shown) to be formed on the capping conductive pattern CAP may be enlarged.

FIGS. 2A to 2E are cross-sectional views illustrating a method of manufacturing a semiconductor device, for example, the semiconductor device shown in FIG. 1, according to an embodiment of the present invention.

Figure 2A:
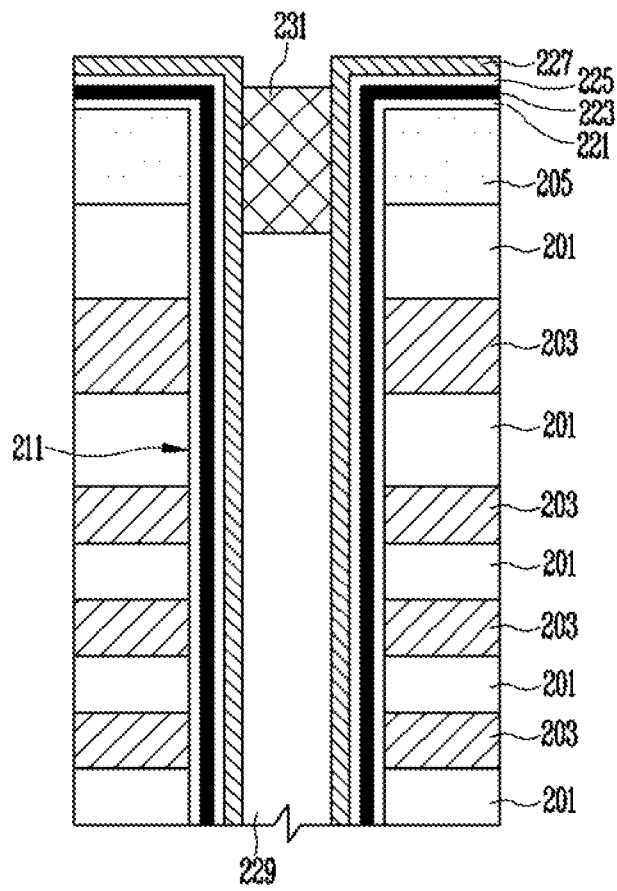

Referring to FIG. 2A, a stacked structure is formed on a bottom structure (not shown) by alternately stacking first material layers 201 and second material layers 203.

The bottom structure may be changed in various ways, according to the shape of a cell structure to be formed. For example, the bottom structure may be a semiconductor substrate including a source area, or a pipe gate including pipe channel holes filled with a sacrificial layer.

The number of stacked first material layers 201 and second material layers 203 may be varied. The first material layers 201 is formed on layers on which interlayer insulating patterns are to be formed, and the second material layers 203 is formed on layers on which the conductive patterns are to be formed. The second material layers 203 may be formed of a different material from the first material layers 201. Specifically, the second material layers 203 may be formed of a material having an etch selectivity with respect to the first material layers 201. For example, the first material layers 201 may be formed of a material used for forming an interlayer insulating pattern, and the second material layers 203 may be formed of a material used for forming a conductive pattern. Alternatively, the first material layers 201 may be formed of the material used for forming an interlayer insulating pattern, and the second material layers 203 may be formed of an insulating material used for forming a sacrificial layer. An oxide layer, such as a silicon oxide layer, may be used as the material for forming an interlayer insulating pattern. A nitride layer having an etch selectivity with respect to an oxide layer may be used as the insulating material for forming a sacrificial layer.

After the stacked structure including the first material layers 201 and the second material layers 203 is formed, a mask pattern 205 is formed on the stacked structure. The mask pattern 205 includes a first opening area that opens an area at which a through-hole 211 is to be formed. The mask pattern 205 may be formed of a nitride layer.

Next, a through-hole 211 passing through the first material layers 201 and the second material layers 203 is formed by etching the first material layers 201 and the second material layers 203, which are exposed through the first opening area of the mask pattern 205. Then, a multilayered dielectric layer 221, 223, and 225 is formed along a surface of the through-hole 211 and a surface of the mask pattern 205, and a channel layer 227 is formed along a surface of the multilayered dielectric layer 221, 223, and 225. The multilayered dielectric layer 221, 223, and 225 may be formed by forming a charge blocking layer 221 along the surfaces of the through-hole 211 and the mask pattern 205, forming a data storage layer 223 along a surface of the charge blocking layer 221, and forming a tunnel insulating layer 225 along a surface of the data storage layer 223.

Next, a center part of the through-hole 211 opened by the channel layer 227 is filled with a core insulating layer 229. The core insulating layer 229 may be formed to be lower than a stacked height of the first material layers 201 and the second material layers 203. Specifically, the core insulating layer 229 may be formed lower than an upper surface of the uppermost layer of the second material layers 203 and higher than an upper surface of the uppermost layer of the first material layers 201. The core insulating layer 229 may be formed by filling the center part of the through-hole 211 to be lower than the through-hole 211 with a gap-fill material that may easily fill a gap, and then annealing the gap-fill material. For example, the core insulating layer 229 may be formed by filling the center part of the through-hole 211 with PSZ to be lower than the stacked height of the first material layers 201 and the second material layers 203, and annealing the PSZ to be transferred to a silicon oxide layer.

As described above, when the center part of the through-hole 211 is filled with a gap-fill material, the height of the gap-fill material is controlled in such a way that the through-hole 211 is not fully filled with the gap-fill material. According to the embodiment of the present invention, an additional process of subsequently etching the core insulating layer 229 will make the height of the core insulating layer 229 smaller than that of the through-hole 211. When etching the core insulating layer 229, it is difficult to control the height of the core insulating layer 229 to be uniform due to residues remaining in the core insulating layer 229. Specifically, PSZ includes hydrogen and nitrogen, which are mixed, therefore the hydrogen and nitrogen may remain at a non-uniform height in annealed PSZ after an annealing process. The hydrogen and nitrogen remaining at a non-uniform height may cause the annealed PSZ to be non-uniformly etched. According to the embodiment of the present invention, to fundamentally prevent the core insulating layer 229 from being non-uniformly etched, the core insulating layer 229 is formed to have a uniform height by controlling the height of a gap-fill material while forming the gap-fill material.

A protection layer 231 is formed on the core insulating layer 229. The protection layer 231 may be formed of a material for protecting the core insulating layer 229 from being damaged in subsequent processes including a process of etching the channel layer 227 and a process of etching the multilayered dielectric layer 221, 223, and 225. For example, the protection layer 231 may be formed of a spin-on-carbon (SOC) layer.

Figure 2B:
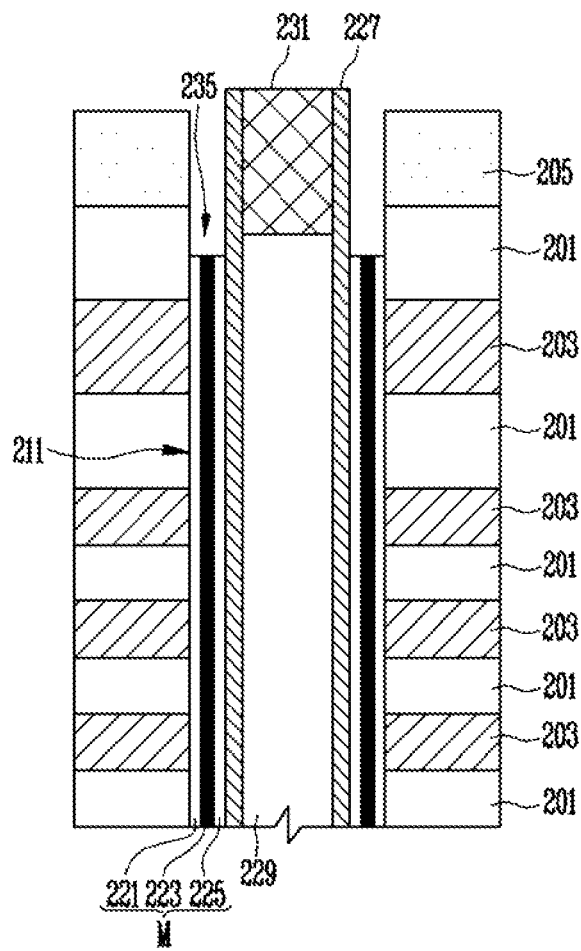

Referring to FIG. 2B, a part of the channel layer 227 exposed by the protection layer 231 and formed on the mask pattern 205 is etched to expose the multilayered dielectric layer 221, 223, and 225 on the mask pattern 205. The channel layer 227 formed of polysilicon may be etched by nitric acid.

Next, a part of the multilayered dielectric layer 221, 223, and 225 formed along the surface of the mask pattern 205 is etched. The process of etching the multilayered dielectric layer 221, 223, and 225 may include etching the tunnel insulating layer 225 to expose the data storage layer 223, etching the data storage layer 223 to expose the charge blocking layer 221, and etching the charge blocking layer 221 to expose the mask pattern 205. The tunnel insulating layer 225 and the charge blocking layer 221 which are formed of oxide layers may be etched by a dry etching process, and the data storage layer 223 formed of a nitride layer may be etched by an etching process using phosphoric acid. The multilayered dielectric layer 221, 223, and 225 remaining after the etching process is defined as a multilayered dielectric pattern M. The multilayered dielectric pattern M may be lower than an upper surface of the core insulating layer 229. Additionally, the multilayered dielectric pattern M may be formed to be higher than an upper surface of the uppermost second material layer among the first material layers 201 and the second material layers 203. A part of the through-hole 211 opened by removing a part of multilayered dielectric layer 221, 223, and 225 is defined as a first recess area 235.

According to the embodiment of the present invention, the channel layer 227 and the multilayered dielectric layer 221, 223, and 225 are etched while the core insulating layer 229 is protected by the protection layer 231. In this manner, a change of the height of the core insulating layer 229 occurring while etching the channel layer 227 and the multilayered dielectric layer 221, 223, and 225, may be prevented.

Referring to FIG. 2C, the protection layer 231 is removed to expose the core insulating layer 229 and a second recess area 237 is defined on the center area of the channel layer 227 on which the protection layer 231 is removed.

Then, the size of the mask pattern 205 is reduced using an etching process such that the reduced mask pattern 205A has a second opening area 239 with a greater width than the first opening area illustrated in FIG. 2A. The second opening area 239, which is defined by the reduced mask pattern 205A, exposes a part of the uppermost surface of the first material layers 201 and the second material layers 203, and forms to have a greater width than the through-hole 211. The second opening area 239 includes the first opening area.

Referring to FIG. 2D, a capping conductive layer 241 filling the first recess area 235, the second recess area 237, and the second opening area 239, and covering the reduced mask pattern 205A, the multilayer dielectric pattern M, the channel layer 227, and the core insulating layer 209, is formed.

Referring to FIG. 2E, a surface of the capping conductive layer 241 shown in FIG. 2D is planarized until the reduced mask pattern 205A is exposed. The reduced mask pattern 205A may be used as a planarization stopping layer. The planarization process may be performed using a chemical mechanical polishing (CMP) method. By planarizing the capping conductive layer 241, a capping conductive pattern CAP is formed.

While the capping conductive layer 241 is planarized, a surface of the channel layer 227 shown in FIG. 2D is planarized to form a channel pattern CH. An upper surface of the channel pattern CH may be at the same level as an upper surface of the capping conductive pattern CAP. The channel pattern CH and the capping conductive pattern CAP are formed to be higher than the uppermost surface of the first material layers 201 and the second material layers 203, and protrude over the through-hole 211. Depending on the planarization-stop height in the planarization process, the capping conductive pattern CAP may be formed to cover the upper surface of the channel pattern CH, and the channel pattern CH may not be opened.

The capping conductive pattern CAP may fill the first recess area 235, the second recess area 237, and the second opening area 239. Since the capping conductive pattern CAP fills the second opening area 239 formed wider than the through-hole 211, an overlay margin of a contact plug, which is to be formed on the capping conductive pattern CAP in a subsequent process, may be enlarged.

Then, the reduced mask pattern 205A is fully removed. The first material layers 201 and the second material layers 203 are etched to form a slit that separates the first material layers 201 and the second material layers 203 into units of desired patterns. The slit may be formed in various shapes, and a subsequent process after forming the slit may be modified depending on material properties of the first material layers 201 and the second material layers 203.

For example, when the first material layers 201 is formed of a material for forming an interlayer insulating pattern and the second material layers 203 is formed of a material for forming a conductive pattern, the slit may be formed by a memory block unit. In this process of forming the slit, the conductive patterns CP and the interlayer insulating patterns ILD that have the structures illustrated in FIG. 1, may be formed.

In the above-described embodiment according to the present invention, the channel pattern CH is formed in the type of a tube surrounding the core insulating layer 229. In other embodiments according to the present invention, the channel pattern CH may be formed by filling the center part of the through-hole 211 with the channel layer 227. The process of forming the core insulating layer 229 and the protection layer 231 may be omitted.

FIG. 3 is a cross-sectional view illustrating a method of manufacturing a semiconductor device according to an embodiment of the present invention. In particular, FIG. 3 is a cross-sectional view showing another embodiment of a process which follows the process illustrated in FIG. 2E. FIG. 3 shows an example in which the first material layers 201 is formed of a material for forming an interlayer insulating pattern and the second material layers 203 is formed of a material for forming a sacrificial layer. Reference numerals that are not illustrated in FIG. 3 are those duplicated with the reference numerals illustrated in FIGS. 2A to 2E, and refer to the same components as in FIGS. 2A to 2E.

Referring to FIG. 3, after the reduced mask pattern 205A illustrated in FIG. 2E is fully removed, the first material layers 201 and the second material layers 203 illustrated in FIG. 2E are etched to form a slit 351, which separates the first material layers 201 and the second material layers 203 into line patterns. By the slit 351, the first material layers 201 are separated into interlayer insulating patterns ILD, and the second material layers 203 for forming a sacrificial layer are exposed.

Next, the exposed second material layers 203 for forming the sacrificial layer are selectively removed, a conductive material is formed to fill areas in which the second material layers 203 are removed, and conductive patterns CP are formed by removing a part of the conductive material in the slit 351.

Figure 4:
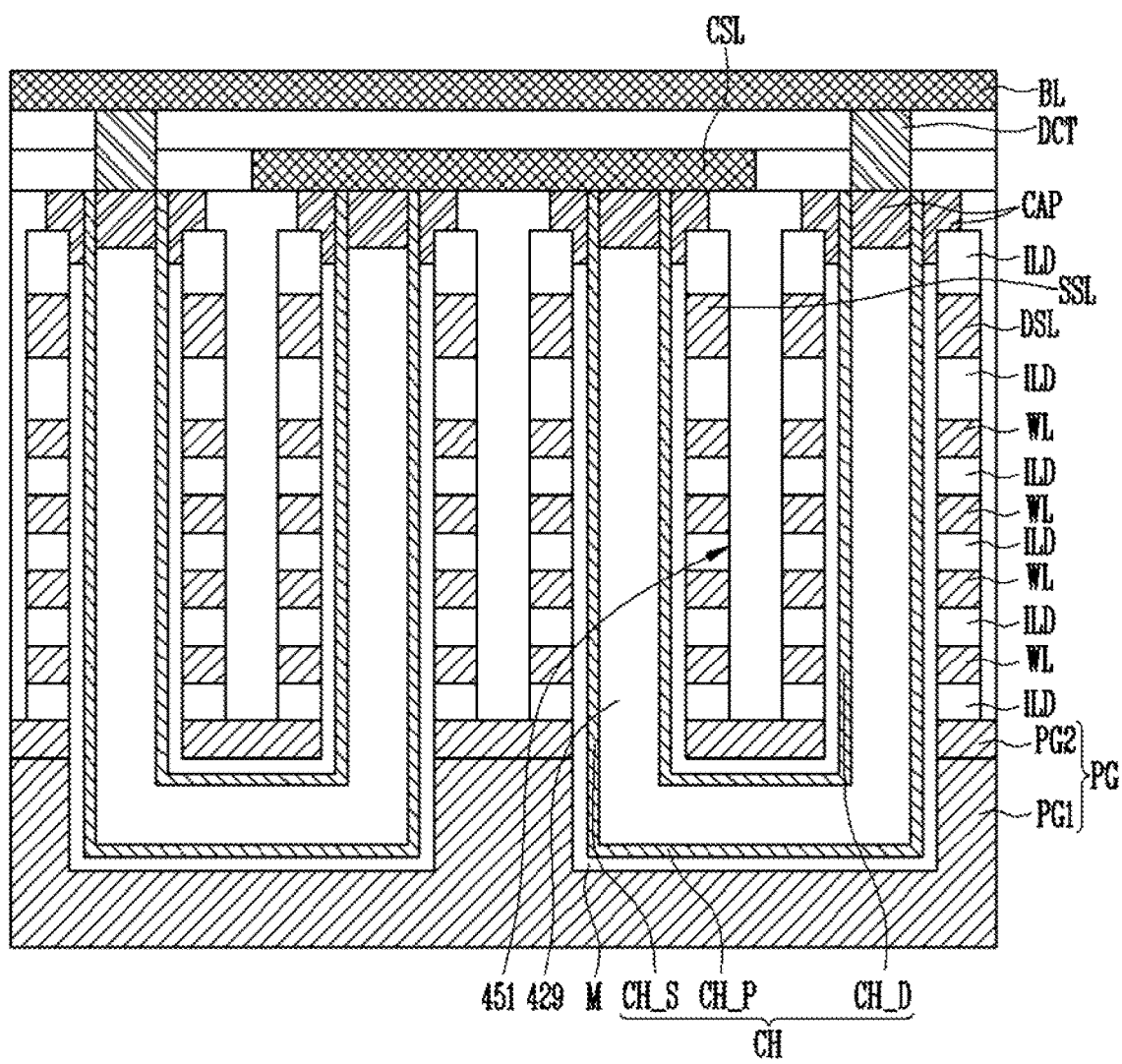
FIG. 4 is a cross-sectional view illustrating a cell structure of a semiconductor device according to an embodiment of the present invention.

FIG. 4 is a cross-sectional view illustrating a cell structure of a semiconductor device according to an embodiment of the present invention. In FIG. 4, memory cells are arranged along a U-shaped through-structure to configure a three-dimensional memory string.

As shown in FIG. 4, the cell structure includes stacked structures including interlayer insulating patterns ILD and conductive patterns WL, SSL, and DSL that are alternately stacked on a pipe gate PG. The stacked structures are formed on the pipe gate PG. The cell structure may further include the U-shaped through-structure. The through-structure includes, as illustrated in FIG. 1, a core insulating layer 429, a channel pattern CH surrounding the core insulating layer 429, and a multilayered dielectric pattern M surrounding the channel pattern CH. Constituent materials and heights of the core insulating layer 429, the channel pattern CH, and the multilayered dielectric pattern M are the same as those illustrated in FIG. 1.

The stacked structures include a source-side stacked structure and a drain-side stacked structure. Conductive patterns configuring the source-side stacked structure include at least one first select line SSL, and word lines WL disposed between the first select line SSL and the pipe gate PG. Conductive patterns configuring a drain-side stacked structure includes at least one second select line DSL, and word lines WL disposed between the second select line DSL and the pipe gate PG. The first select line SSL may be a source select line, and the second select line DSL may be a drain select line.

The channel pattern CH includes a first straight channel part CH_S passing through the source-side stacked structure, a second straight channel part CH_D passing through the drain-side stacked structure, and a pipe channel part CH_P connecting the first straight channel part CH_S and the second straight channel part CH_D. The pipe channel part CH_P may be disposed under the stacked structures and surrounded by the pipe gate PG. The number of straight channel parts connected to the pipe channel part CH_P is not limited to two, but may be changed depending on the shape of the through-structure. For example, when forming a W-shaped through-structure, three straight channel parts passing through the stacked structures may be connected to the pipe channel part CH_P.

The pipe gate PG may include a first pipe gate PG1 surrounding a sidewall and a bottom surface of the pipe channel part CH_P, and a second pipe gate PG2 covering an upper surface of the pipe channel part CH_P on the first pipe gate PG1.

The source-side stacked structure and the drain-side stacked structure may be separated by a slit 451 formed between the first straight channel part CH_S and the second straight channel part CH_D.

The first straight channel part CH_S and the second straight channel part CH_D may protrude over the uppermost surface of the stacked structures and may be in contact with the capping conductive patterns CAP formed wider than the first straight channel part CH_S and the second straight channel part CH_D. The shape and material properties of the capping conductive patterns CAP are the same as those illustrated in FIG. 1. The capping conductive pattern CAP connected to the first straight channel part CH_S is connected to a source line CSL, and the capping conductive pattern CAP connected to the second straight channel part CH_D is connected to a bit line BL. The source line CSL and the bit line BL are conductive lines. The bit line BL may be connected to a drain contact plug DCT formed on the capping conductive pattern CAP. In this case, the bit line BL may be connected to the capping conductive pattern CAP via the drain contact plug DCT. Since the drain contact plug DCT according to the embodiment of the present invention is formed on the capping conductive pattern CAP having a large width, misalignment between the drain contact plug DCT and the capping conductive pattern CAP may be reduced.

According to the above-described structure, at least one drain select transistor, memory cells, and at least one source select transistor that are connected in series, configure a memory string arranged in a U shape.

The above-described cell structure may be formed by performing the processes illustrated in FIGS. 2A to 3 after forming the pipe gate PG including a pipe trench filled with a sacrificial layer.

Figure 5:
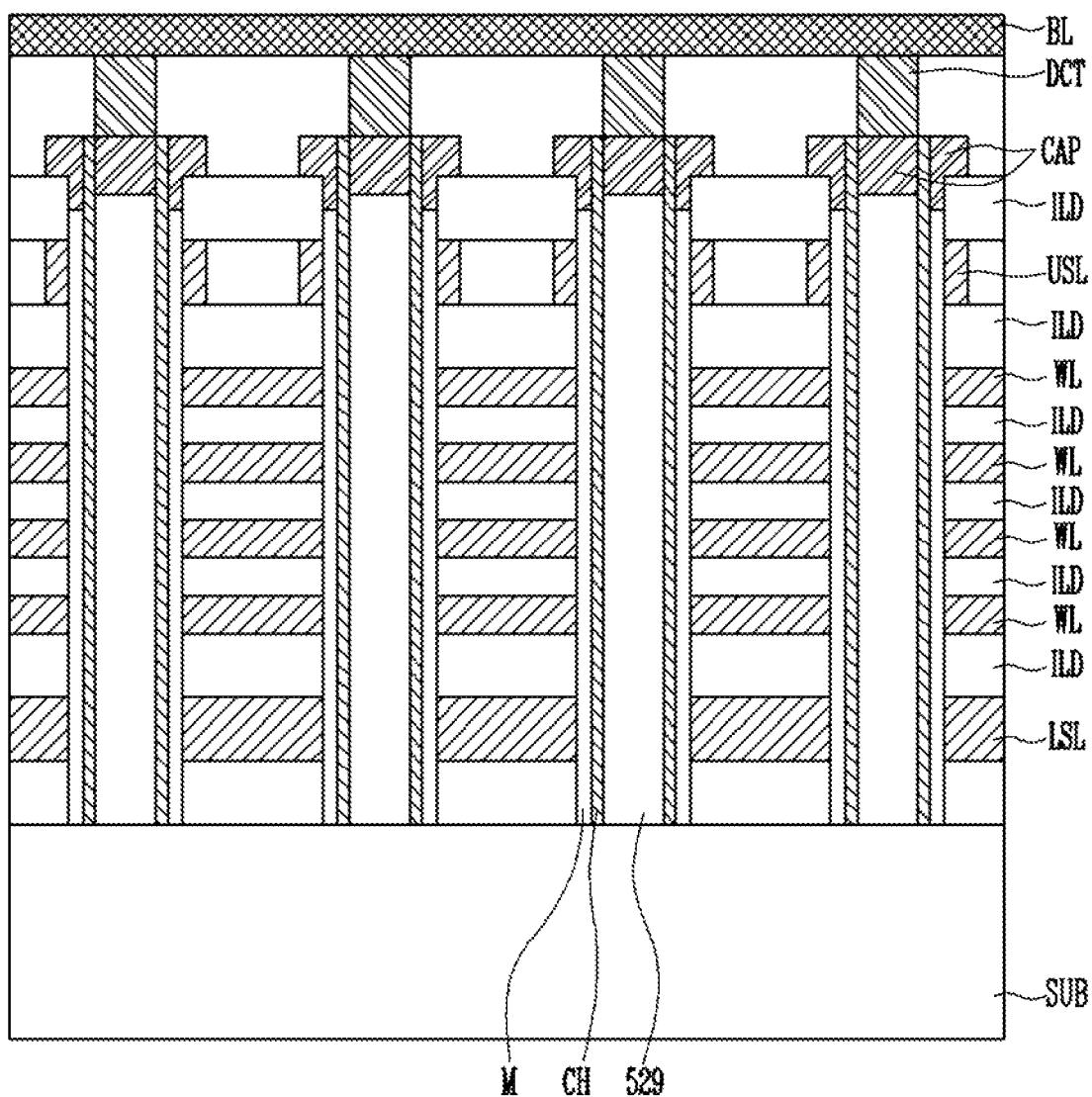
FIG. 5 is a cross-sectional view illustrating a cell structure of a semiconductor device according to an embodiment of the present invention.

FIG. 5 is a cross-sectional view illustrating a cell structure of a semiconductor device according to an embodiment of the present invention. In particular, FIG. 5 shows memory cells that configure a three-dimensional memory string arranged along a straight-type through-structure.

As shown in FIG. 5, the cell structure includes alternately stacked interlayer insulating patterns ILD and conductive patterns LSL, WL, and USL on a semiconductor substrate SUB. The cell structure may further include a straight-type through-structure. The through-structure includes, as illustrated in FIG. 1, a core insulating layer 529, a channel pattern CH surrounding the core insulating layer 529, and a multilayered dielectric pattern M surrounding the channel pattern CH. Constituent materials and heights of the core insulating layer 529, the channel pattern CH, and the multilayered dielectric pattern M are the same as those illustrated in FIG. 1.

The conductive patterns LSL, WL, and USL may include at least one first select line LSL, word lines WL disposed on the first select line LSL, and at least one second select line USL disposed on the word lines WL. The word lines WL may be formed in a plate shape, and one of the first and second select lines USL and LSL may be formed in a line shape. Alternatively, the word lines WL and the first and second select lines USL and LSL may be formed in line shapes.

A bottom of the channel pattern CH may be connected to a source area of the semiconductor substrate SUB. The channel pattern CH may be in contact with the capping conductive pattern CAP protruding over the uppermost surface of the alternately stacked interlayer insulating patterns ILD and conductive patterns LSL, WL, and USL and having a greater width than the channel pattern CH. The shape and material properties of the capping conductive pattern CAP are the same as those illustrated in FIG. 1. A drain contact plug DCT may be connected to the capping conductive pattern CAP. Since the drain contact plug DCT according to the embodiment of the present invention, is formed on the capping conductive pattern CAP having a large width, a misalignment between the drain contact plug DCT and the capping conductive pattern CAP may be reduced. A conductive line, that is, the bit line BL may be connected onto the drain contact plug DCT.

According to the above illustrated structure, at least one first select transistor, memory cells, and at least one second select transistor, which are connected in series, configure a memory string arranged in a line.

The above-described cell structure may be formed on the semiconductor substrate SUB including a source area using the processes illustrated in FIGS. 2A to 3.

Figure 6:
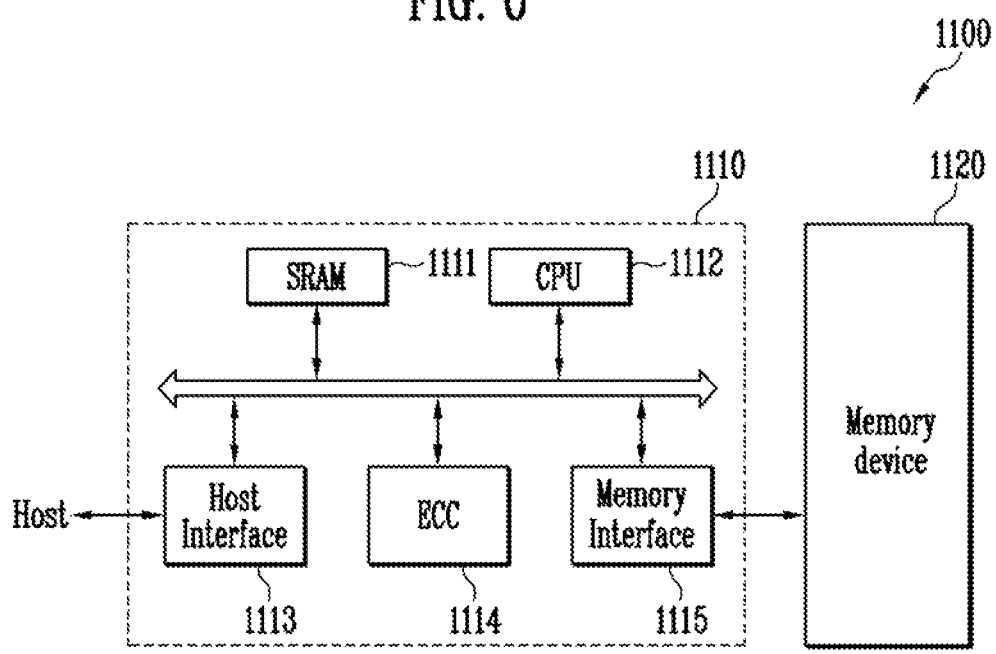
FIG. 6 is a block diagram illustrating a memory system according to an embodiment of the present invention.

FIG. 6 is a block diagram illustrating a memory system according to an embodiment of the present invention.

Referring to FIG. 6, the memory system 1100 according to the embodiment of the present invention, includes a memory device 1120 and a memory controller 1110.

The memory device 1120 has a structure described in the above-described embodiments with reference to FIGS. 1 to 5. In addition, the memory device 1120 may be a multi-chip package composed of a plurality of flash memory chips.

The memory controller 1110 may be configured to control the memory device 1120, and include an SRAM 1111, a CPU 1112, a host interface 1113, an ECC 1114, and a memory interface 1115. The SRAM 1111 is used as an operation memory of the CPU 1112, the CPU 1112 performs overall control operations for exchanging data of the memory controller 1110, and the host interface 1113 includes a data exchange protocol of a host connected to the memory system 1100. In addition, the ECC 1114 detects and corrects errors included in data read from the memory device 1120, and the memory interface 1115 performs interfacing with the memory device 1120. Additionally, the memory controller 1110 may further include a ROM that stores code data for interfacing with the host, etc.

The memory system 1100 having the above-described configuration may be a memory card or a solid-state disk (SSD) in which the memory device 1120 and the memory controller 1110 are combined. For example, when the memory system 1100 is an SSD, the memory controller 1110 may communicate with an external apparatus (for example, a host) through one of various interface protocols, such as a USB, an MMC, a PCI-E, a SATA, a PATA, an SCSI, an ESDI, and an IDE.

Figure 7:
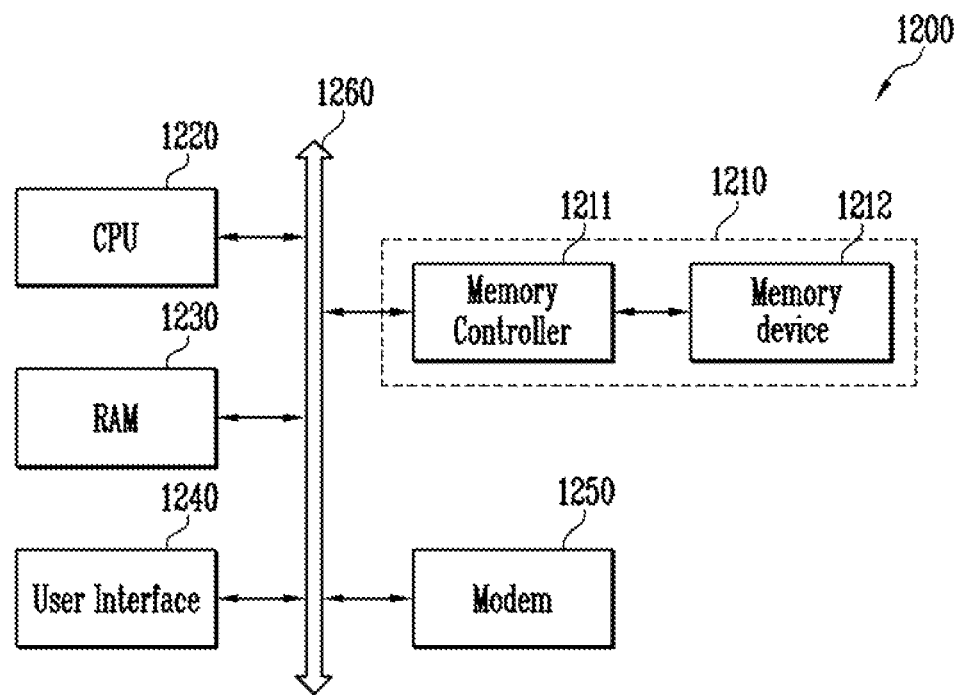
FIG. 7 is a block diagram illustrating a computing system according to an embodiment of the present invention.

FIG. 7 is a block diagram illustrating a computing system according to an embodiment of the present invention.

Referring to FIG. 7, the computing system 1200 according to the embodiment of the present invention may include a CPU 1220, a RAM 1230, a user interface 1240, a modem 1250, and a memory system 1210, that are electrically connected to a system bus 1260. In addition, when the computing system 1200 is a mobile apparatus, a battery for supplying operation voltage to the computing system 1200 may be further included, and an application chipset, a camera image processor (CIS), a mobile DRAM, etc. may also be included.

The memory system 1210 may be composed of a memory device 1212 and a memory controller 1211, as illustrated with reference to FIG. 6.

According to the embodiments of the present invention, during a process of forming a through-hole, an area opened by a mask pattern is enlarged by reducing a size of the mask pattern using an etching process before completely removing the mask pattern used as an etch barrier. Next, a capping conductive pattern is formed in the enlarged open area of the mask pattern. Accordingly, since the capping conductive pattern is formed to have a greater width than the through-hole, an overlay margin of a contact plug formed on the capping conductive pattern may be ensured.

According to the embodiments of the present invention, since a channel pattern is formed to protrude over the through-hole, a contact area between the channel pattern and the capping conductive pattern increases, and resistance of the channel pattern may be reduced.

In the drawings and specification, there have been disclosed typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device, comprising:
   a stacked structure including alternately stacked conductive patterns and interlayer insulating patterns;
   a through-hole passing through the stacked structure;
   a channel pattern formed in the through-hole and protruding from an inside of the through hole over the through-hole; and
   a capping conductive pattern having a first surface being in contact with a second surface of the protruded channel pattern and formed to have a width greater than the through-hole,
   wherein the first surface and the second surface are parallel to a direction in which the conductive patterns and the interlayer insulating patterns are stacked, and
   wherein the protruded channel pattern extends to pass through an upper surface and a bottom surface of the capping conductive pattern.

2. The semiconductor device of claim 1, further comprising a core insulating layer formed under the capping conductive pattern to fill a center part of the through-hole with a height lower than the stacked structure, and surrounded by the channel pattern.

3. The semiconductor device of claim 2, wherein the core insulating layer is formed to be lower than the uppermost insulating pattern among the interlayer insulating patterns and higher than the uppermost conductive pattern formed under the uppermost insulating pattern among the conductive patterns.

4. The semiconductor device of claim 2, further comprising a multilayered dielectric pattern surrounding the channel pattern along an inner wall of the through-hole.

5. The semiconductor device of claim 4, wherein the multilayered dielectric pattern is formed to be lower than the core insulating layer.

6. The semiconductor device of claim 5, wherein the capping conductive pattern comprises:
   a first part filling the inner part of the channel pattern on the core insulating layer and protruding over the stacked structure; and
   a second part filling the through-hole on the multilayered dielectric pattern and covering a part of an upper surface of the stacked structure.

7. The semiconductor device of claim 1, further comprising:
   a contact plug formed on the capping conductive pattern; and
   a conductive line formed on the contact plug.

8. The semiconductor device of claim 1, wherein the channel pattern is formed as a straight-type.

9. The semiconductor device of claim 8, further comprising a semiconductor substrate including a source area connected to a bottom of the channel pattern, and disposed under the stacked structure.

10. The semiconductor device of claim 1, wherein the channel pattern further comprises:
    two or more straight channel parts passing through the stacked structure;
    a pipe channel part connecting the straight channel parts under the stacked structure;
    a pipe gate surrounding the pipe channel part; and
    a slit passing through the stacked structure between the straight channel parts.

11. The semiconductor device of claim 1, wherein the protruded channel pattern penetrates into the capping conductive pattern.

12. The semiconductor device of claim 1, wherein the upper surface of the capping conductive pattern is disposed at the same level as an upper surface of the protruded channel pattern.

13. The semiconductor device of claim 1, wherein the capping conductive pattern includes a first part and a second part separated by the protruded channel pattern.

* * * * *